US011467760B1

(12) United States Patent
Avron et al.

(10) Patent No.: US 11,467,760 B1
(45) Date of Patent: Oct. 11, 2022

(54) SELECTIVE ERASURE DECODING FOR MEMORY DEVICES

(71) Applicant: Amazon Technologies, Inc., Seattle, WA (US)

(72) Inventors: Itai Avron, Petah Tikva (IL); Erez Sabbag, Koranit (IL); Anna Rom-Saksonov, Rosh Haayin (IL)

(73) Assignee: Amazon Technologies. Inc., Seattle, WA (US)

( * ) Notice: Subject to any disclaimer, the term of this patent is extended or adjusted under 35 U.S.C. 154(b) by 122 days.

(21) Appl. No.: 17/247,242

(22) Filed: Dec. 4, 2020

(51) Int. Cl.
*G06F 3/06* (2006.01)
*G06F 11/10* (2006.01)
*H03M 13/29* (2006.01)

(52) U.S. Cl.
CPC .......... *G06F 3/0652* (2013.01); *G06F 3/0604* (2013.01); *G06F 3/0655* (2013.01); *G06F 3/0673* (2013.01); *G06F 11/10* (2013.01); *H03M 13/293* (2013.01)

(58) Field of Classification Search
CPC .... G06F 3/0652; G06F 3/0604; G06F 3/0655; G06F 3/0673; G06F 11/10
See application file for complete search history.

(56) References Cited

U.S. PATENT DOCUMENTS

2008/0098280 A1* 4/2008 Andersen ............... G11B 20/18 714/766
2017/0177259 A1* 6/2017 Motwani ............. G06F 11/1012

\* cited by examiner

*Primary Examiner* — Kyle Vallecillo
(74) *Attorney, Agent, or Firm* — Weaver Austin Villeneuve & Sampson LLP

(57) ABSTRACT

Systems, apparatuses, and corresponding techniques are described for selective erasure decoding on memory devices. Erasure decoding is performed on error correction codes (ECCs) read from memory locations associated with errors that are correctable through erasure decoding, as indicated by erasure information available to a memory controller or other device configured to decode ECCs. The erasure information can indicate locations within individual memory devices and, optionally, at different memory hierarchy levels. When the erasure information indicates that a location being read from is not associated with an error that is correctable through erasure decoding, regular error decoding is performed on ECCs read from such locations. Selective erasure decoding can be performed in connection with separate read operations that access different memory devices or a single read operation that accesses multiple memory devices concurrently.

20 Claims, 7 Drawing Sheets

SELECTIVE ERASURE DECODING FOR MEMORY DEVICES

BACKGROUND

Data errors can occur when one or more bits of a block of data are flipped from 0 to 1 or vice versa. For instance, one or more bits in a data word may be written into memory incorrectly so that a combination of correct values and incorrect values are stored for the data word. Sometimes, data that was written correctly later becomes corrupted. Errors can also occur when reading from memory even if the data is stored correctly. Sometimes, no value can be written to or read from a memory location. Errors can occur for various reasons, often due to a faulty device in the memory. Depending on what the data stored in the memory is used for, errors may be tolerated to a certain extent or may necessitate replacement of the memory, e.g., swapping in a new memory module. In some instances, such as when the memory is on a server of a datacenter, it is likely that any error will be deemed fatal unless the error can be corrected, for example, through use of storage redundancy. Extra storage can be costly, making it impractical to implement storage redundancy in some instances. Some computer systems provide spare memory resources that can be substituted for faulty memory, e.g., by mapping from faulty memory to the spare memory resources. Such mapping enables the faulty memory to be substituted without having to physically replace the faulty memory. However, as with storage redundancy, it can be cost prohibitive to configure a computer system with additional resources.

There are a variety of error checking methods that differ with respect to their ability to detect and/or correct errors. A relatively simple way to check for errors is to use parity bits to store a checksum for data written to memory. The checksum can be used to determine whether an error was introduced during, for example, storage or subsequent reading. However, checksum-based error detection cannot recover the original data. In comparison, error correction codes (ECCs) are more robust and allow recovery of the original data in some instances. Some ECCs can be used to detect error locations and determine error magnitude. In addition to detecting unknown errors and determining error magnitude, some ECCs can be used to correct erasure errors, which are ECC errors at known locations, through erasure decoding. The total number of errors that can be corrected by an ECC is finite.

BRIEF DESCRIPTION OF THE DRAWINGS

Various embodiments in accordance with the present disclosure will be described with reference to the drawings, in which.

DETAILED DESCRIPTION

Figure 1:
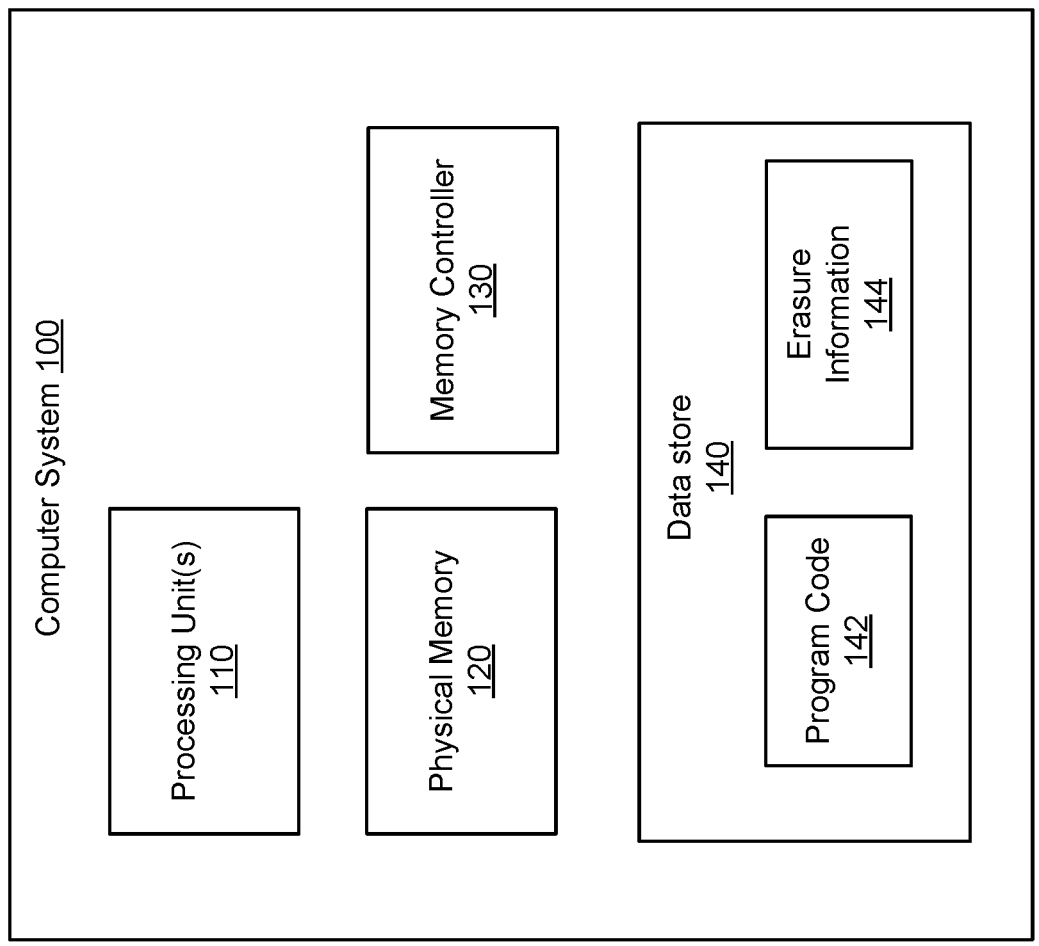
FIG. 1 is a simplified block diagram of an example computer system usable for implementing one or more embodiments.

Techniques and corresponding embodiments are described herein for extending the lifespan of a physical memory including a plurality of memory devices. To extend the lifespan of physical memory, embodiments are described in which erasure decoding is selectively applied to different memory devices that form the physical memory. In particular, certain embodiments provide for the maintaining of erasure information indicating memory locations that are associated with erasure errors (ECC errors that are correctable through erasure decoding). The erasure information can be used to declare erasure locations within the memory devices that form the physical memory. This enables erasure decoding to be used for correcting erasure errors across different areas of the physical memory and, optionally, across different memory hierarchy levels. Additionally, selective erasure decoding can reduce the likelihood of a non-recoverable error as different portions of memory are accessed over the course of multiple memory accesses. Advance knowledge of erasure locations may increase the total number of errors that can be corrected. This further contributes to the lifespan of the physical memory by allowing the physical memory to run longer before encountering a non-recoverable error, especially when errors are sparsely distributed across memory areas rather than being concentrated in any particular region of memory.

Reed-Solomon codes are one example of an ECC designed to exploit knowledge of erasure locations. Reed-Solomon codes are sometimes used to implement ECC schemes for dynamic random-access memory (DRAM). When Reed-Solomon encoding is used to encode a block of data having k number of data symbols (each symbol being one or more bits in length), using t number of check symbols to form an encoded message n symbols in length, the maximum number of errors that can be detected and corrected for the block of data (i.e., incorrect values at unknown locations) is equal to the floor of t/2 (since t/2 is not always a whole number). However, when the errors are erasure errors whose locations are known in advance, the maximum number of erasure errors that can be corrected by applying erasure decoding to a Reed-Solomon code is equal to t. If the errors include a combination of erasure errors and unknown errors, then the maximum number of correctable errors is somewhere between t and floor(t/2). Thus, knowledge of erasure locations leads to an increase in the number of errors that can be corrected relative to trying to detect and correct errors that are unknown.

An ECC (sometimes referred to as a codeword) usually includes a combination of data symbols and error checking or parity symbols. The ECC/codeword as stored in memory or as read out of memory may include errors such as bit flips. The process of decoding an ECC to detect unknown errors and to correct any detected errors is referred to as error decoding. The same decoding algorithm that is used for computing error magnitudes during error decoding can be used for computing error magnitudes during erasure decoding when erasure locations are provided as input to the decoding algorithm. Various decoding algorithms exist for Reed-Solomon codes and for other types of ECCs. As applied to DRAM devices that form a DRAM module, conventional ECC schemes provide for erasure decoding at the device level through making a "global" declaration that an entire DRAM device is faulty once an error has been identified in any location covered by the address space associated with the DRAM device. Once the DRAM device has been declared faulty, erasure decoding is applied to any location to be accessed in the DRAM device. However, after the DRAM device has been declared faulty, and depending on the ECC scheme used, erasure decoding is not necessarily applied to other DRAM devices in the DRAM module, so there is an increased likelihood that any errors that are subsequently encountered in another DRAM device will not be recoverable. This includes errors in another DRAM device that could have been corrected using erasure decoding. Instead, when such subsequent errors are encountered, the solution is usually to swap in a new DRAM module.

Additionally, there are situations where applying erasure decoding to a first DRAM device reduces the ability to detect and correct for errors in other DRAM devices. For instance, data may be stored in a distributed manner across both the first DRAM device (e.g., a device that has been globally declared as faulty) and a second DRAM device such that accessing the data requires concurrent (e.g., parallel) reading of the first DRAM device and the second DRAM device. For example, due to a codeword being spread over the first DRAM device and the second DRAM device, both DRAM devices may be accessed together at the same address. Therefore, performing erasure decoding on the first DRAM device may necessitate concurrently performing erasure decoding on the second DRAM device even though a corresponding location in the second DRAM device may not require erasure decoding. Because the concurrent erasure decoding consumes parity bits associated with the location in the second DRAM device to attempt to fix non-existent erasure errors, fewer errors can be detected with respect to the location in the second DRAM device. As an illustration, if the first DRAM device is globally marked for erasure due to a fault (e.g., one or more erroneous bits) in bank 0 of the first DRAM device, accessing bank 1 at the same address on both devices will cause erasure decoding to be performed on the data in bank 1 of the second DRAM device even though such decoding is not required. Consequently, if bank 1 of the second DRAM device has a fault for some reason, the ability to detect and correct the fault in bank 1 of the second DRAM device will be reduced. This problem affects not only DRAM devices, but other types of memory where codewords are stored in a distributed manner across memory devices. Thus, global declaration tends to unnecessarily shorten the lifespan of memory. In contrast, the selective erasure decoding featured in embodiments described below can be performed based on "local" declarations of erasure locations within memory devices, thereby enabling erasure decoding to be applied to different memory devices over the course of multiple memory accesses and to specific locations within memory devices.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 is a simplified block diagram of an example computer system 100 that can be used to implement one or more embodiments. The computer system 100 includes one or more processing units 110, a physical memory 120, a memory controller 130, and a data store 140. FIG. 1 is a simplified representation of a computer system. In practice, a computer system implementing an embodiment described herein may include more or fewer components, combine components, or feature a different arrangement of components. In some instances, computer system 100 may be implemented using user-replaceable and/or modular components such as memory modules containing memory chips. Computer system 100 can be a server, a desktop computer, a laptop, a mobile phone, and the like. In some instances, the computer system 100 may be implemented as a system-on-chip (SoC). Additionally, although FIG. 1 shows the components of computer system 100 as being in the same block, the computer system 100 can be implemented as a distributed computer system in which components are not co-located.

Processing units 110 can include general purpose processors (e.g., a central processing unit (CPU), special purpose processors (e.g., a digital signal processor (DSP) or graphics processing unit (GPU), microcontrollers, and the like. Processing units 110 can include a combination of different types of processors, for example, a CPU in combination a GPU and a DSP. The processing unit(s) 110 can be configured to execute instructions (e.g., program code 142) stored in the data store 140.

Physical memory 120 can include volatile memory, non-volatile memory, or both. For instance, the physical memory 120 can include random-access memory such as DRAM or static random-access memory (SRAM). In some instances, the physical memory 120 may include a read-only memory (ROM). The physical memory 120 can be formed using a plurality of memory devices, where each memory device in the physical memory 120 is a memory chip or other discrete storage device. For example, the physical memory 120 can include one or more memory modules such as dual in-line memory modules (DIMMs) or single in-line memory modules (SIMMs). Each memory module can include multiple memory devices. For instance, DRAM modules often include four, eight, or an even greater number of DRAM chips.

The physical memory 120 is assigned an address space, for example, by a processing unit 110. The address space can be allocated among the various memory devices that form the physical memory 120. For instance, a first memory module could be assigned an upper address range and a second memory module assigned a lower address range, with the upper address range and the lower address range being distributed across the memory devices that form the first memory module and the second memory module, respectively. Data accessed as part of executing instructions by the processing unit(s) 110 can be stored in a distributed fashion across the memory devices such that, for a given instruction, multiple memory locations may be read from and/or written to, with the multiple memory locations being locations in the same memory device or different memory devices.

Memory controller 130 can be configured to manage memory accesses, including read operations and write operations. The memory accesses can be triggered based on requests from the processing unit(s) 110. Memory controller 130 can control the rate of data transfer between the physical memory 120 and the processing unit(s) 110. For example, the memory controller 130 can implement a read buffer and/or a write buffer such the rate at which data is read from or written to the physical memory 120 differs from the rate at which the memory controller 130 receives data from or sends data to the processing unit(s) 110. In some instances, the memory controller 130 is a direct memory access (DMA) controller. With DMA, a processing unit initiates a data transfer and receives an interrupt once the data transfer is complete. The processing unit can perform other operations while the data transfer is underway. Memory controller 130 can also be configured to perform operations to optimize utilization of the physical memory 120, such as transferring data directly from one memory device to another to redistribute the data without passing the data through the processing unit(s) 110. Further, in some embodiments, the memory controller 130 may implement virtual addressing, for example, by translating virtual memory addresses to corresponding physical addresses associated with the physical memory 120.

Memory controller 130 is further configured to perform error decoding and erasure decoding in connection with accessing the physical memory 120. For instance, memory controller 130 may include hardware and/or software for implementing an ECC encoder and a corresponding ECC decoder. The memory controller 130 may use the ECC encoder to encode data being written to the physical memory. When encoded data is read from the physical memory, the memory controller 130 may use the ECC decoder to decode the encoded data, detect errors, and attempt error correction. In some embodiments, encoded data is stored in the physical memory as Bose-Chaudhuri-Hocquenghem (BCH) codes or Reed-Solomon codes (Reed-Solomon code being a specific type of BCH code). However, the memory controller 130 may be configured to generate other types of ECCs.

Figure 2:
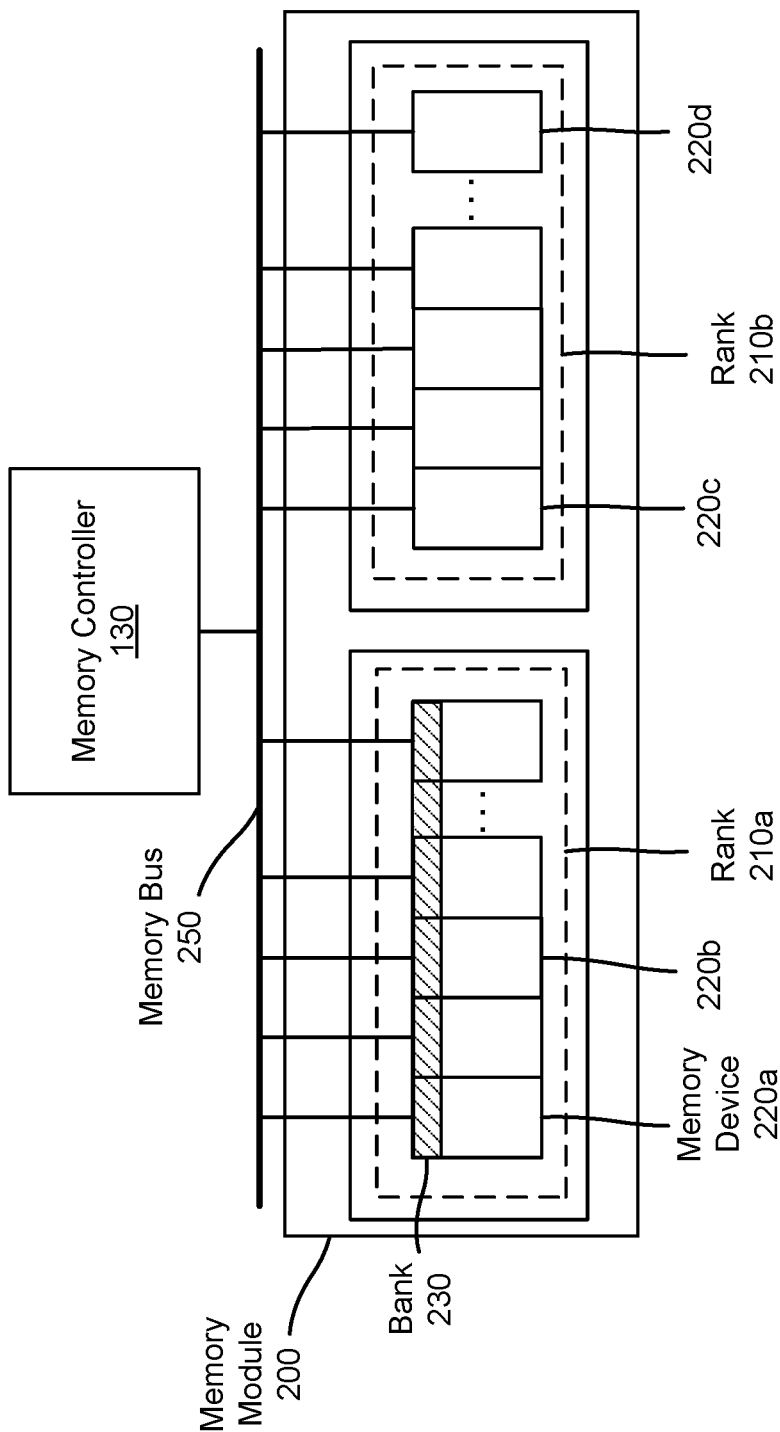
FIG. 2 illustrates an example memory arrangement usable for implementing one or more embodiments.

Data store 140 can include program code 142 executed by the processing unit(s) 110. The program code 142 can include software applications, drivers, an operating system, and the like. As shown in FIG. 1, the data store 140 can also include erasure information 144. The erasure information indicates locations in the physical memory 120 that are associated with errors which can be corrected using erasure decoding. The erasure information 144 can be stored in the form of a table or other data structure and can come from one or more sources. In some instances, the erasure information 144 may be initialized to include erasure information supplied by a computing device external to the memory controller 130, such as a processor of the computer system 100 or a processor of a computer system in communication with the computer system 100 (e.g., over a network). For example, erasure information indicating error locations corresponding to defects identified by a memory device manufacturer during post-manufacturing testing (and that are within an acceptable tolerance range for the total number of such defects) could be written to a table each time the computer system 100 is booted up, and the memory controller could update the erasure information in the table to include additional errors that the memory controller detects during runtime. The erasure information for initializing the table can be stored separately from the table itself and can written to the table by the external computing device as part of a boot operation. Alternatively, the table can be pre-populated so that the initial erasure information is permanently stored as part of the table. As discussed above, erasure information can be specified at one or more memory hierarchy levels. For instance, the erasure information 144 may indicate that any of the following portions of the physical memory 120 are associated with an erasure error: a rank (which can be physical or logical), a memory device (e.g., DRAM chip), a bank group, a bank, a row, or a column. In general, the hierarchy levels at which the erasure information can be specified can include any physical and/or logical subdivision of memory. FIG. 2 shows an example of how memory can be subdivided according to different hierarchy levels.

Although depicted as a separate block, the data store 140 may, in some implementations, be integrated into the physical memory 120. For instance, program code 142 may be stored in ROM and read into RAM for runtime execution. Similarly, the erasure information 144 may be stored in RAM or ROM. In other implementations, the program code 142 and/or the erasure information 144 may be stored on a hard drive, a flash memory, or other storage device that is separate from the physical memory 120.

Memory controller 130 can access the erasure information 144 in connection with performing a read operation on the physical memory 120. For instance, the memory controller 130 may be configured to periodically read from the data store 140 to obtain updated erasure information 144 and to reference the obtained erasure information in connection with a subsequent read operation. The memory controller 130 can access the erasure information 144 each time a read operation is to be performed. Alternatively, the memory controller 130 may perform multiple read operations between successive accesses to the erasure information 144. The obtained erasure information can be provided as "side information" to the ECC decoder of the memory controller 130 and can be generated based on detection of errors in ECCs. Such detection may be performed by the memory controller 130 itself or some other component (e.g., a processing unit 110) that receives data read via the memory controller 130. For example, an error that is in a particular location of the physical memory 120 may initially be unknown when reading from the particular location, but the location can, in some instances, be identified as a result of the memory controller 130 performing error decoding on an ECC read from the particular location. Accordingly, in some embodiments, the memory controller 130 may be configured to update the erasure information 144 stored in the data store 140, based on errors detected after reading from the physical memory 120.

FIG. 2 illustrates an example memory arrangement that is representative of how a physical memory (e.g., the physical memory 120 of FIG. 1) might be configured. In FIG. 2, the memory controller 130 is coupled to a memory module 200 via a memory bus 250. The memory bus 250 can be configured to convey data between the memory controller 130 and the memory module 200. The memory bus 250 or a separate communication bus (not shown) may carry commands (e.g., read or write commands) generated by the memory controller 130. Such commands may cause data to be read onto the memory bus 250 from the memory module 200 or cause data on the memory bus 250 to be written into the memory module 200. For instance, a read command may indicate an address in an address space associated with the memory module 200. The memory bus 250 may couple the memory controller 130 to multiple memory modules 200 that form physical memory.

In some implementations, the memory module 200 may be a DIMM, a SIMM, or other module containing memory devices mounted on a circuit board. As shown in FIG. 2, the memory module 200 can include a plurality of memory devices 220 (e.g., memory devices 220a-220d, each on which can be a DRAM chip). The memory bus 250 can be configured to permit the memory controller 130 to issue multiple commands in parallel. Commands issued in parallel can include read commands, write commands, or a combination of read and write commands. Commands issued in parallel can be directed to locations in the same memory device 220, in different memory devices 220, or in different memory modules 200. When commands are issued in parallel, the memory controller 130 can use the erasure information 144 to concurrently determine whether locations to be accessed are associated with erasure errors. For example, the memory controller 130 may issue a command for a first read operation in parallel with a command for a second read operation. Prior to issuing the commands for the first read operation and the second read operation or, alternatively, after issuing the commands but before decoding data returned from the physical memory 120 in response to the commands, the memory controller 130 can reference the erasure information 144 to concurrently determine whether a location that is the subject of the first read operation or a location that is the subject of the second read operation is associated with an erasure error.

Figure 3:
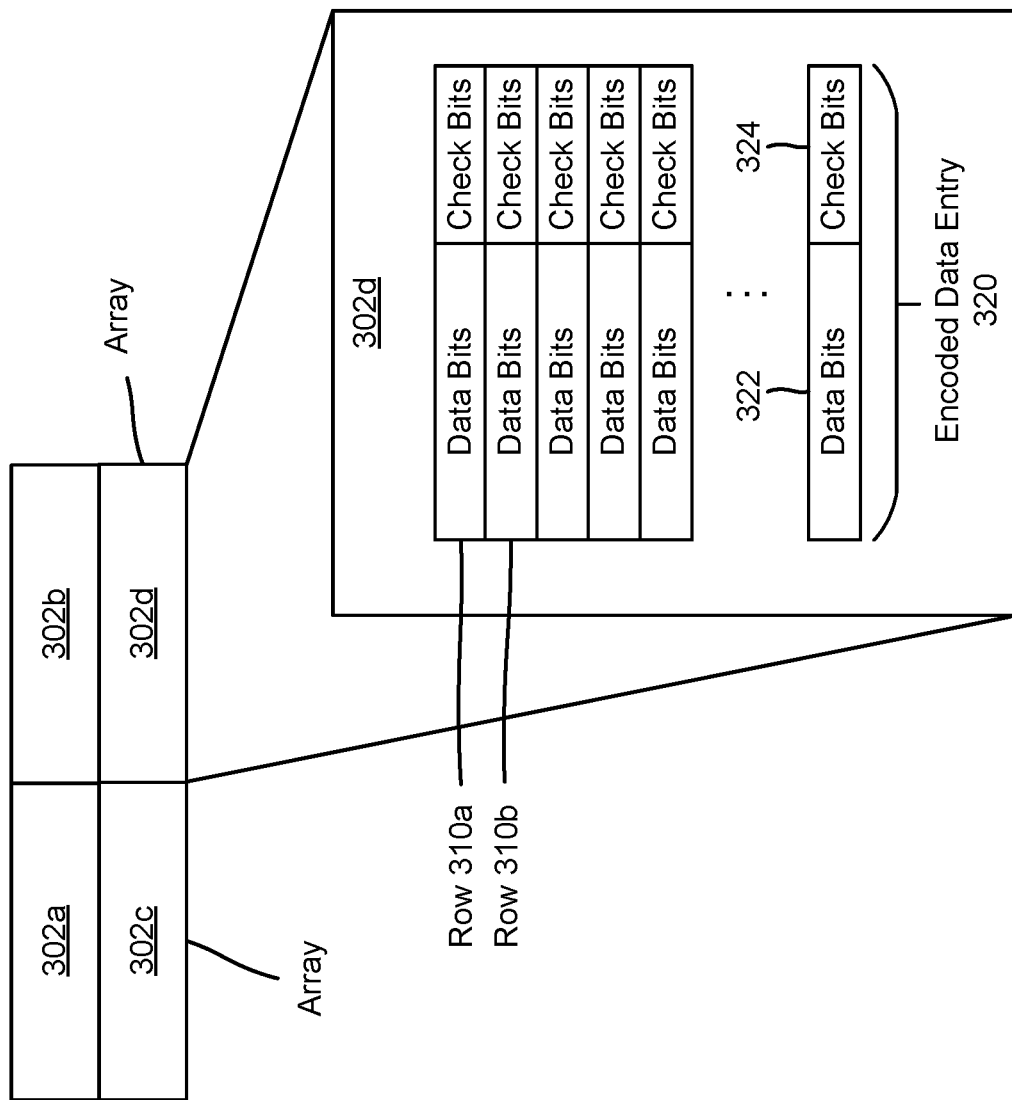
FIG. 3 illustrates an example of how data generated using ECC encoding can be stored.

A group of memory devices 220 can form a rank 210 (e.g., ranks 210a and 210b). Within a rank 210, different portions of memory devices 220 can form banks 230. For simplicity, only one bank 230 is shown in FIG. 2. Banks can be divided into arrays. For instance, the portion of memory device 220a that corresponds to bank 230 can include a plurality of arrays (e.g., four or more arrays, as shown in FIG. 3). Each array can be configured to store blocks of data that are accessible via row selection signals and column selection signals, which can be generated by the memory controller 130. Alternatively, the selection signals can be generated locally within a memory device 220 based on decoding of addresses indicated in commands received from the memory controller 130. For instance, each memory device 220 can include a row decoder, a column decoder, a multiplexer, and the like.

FIG. 3 illustrates an example of how data generated using ECC encoding can be stored in physical memory. In FIG. 3, memory arrays 302a-302d are configured to store data bits (e.g., original data) and check bits (e.g., parity symbols). For instance, an array 302 can be organized in rows 310 (e.g., rows 310a and 310b), with each row 310 being configured to store an encoded data entry 320 comprising a sequence of data bits 322 followed by a sequence of check bits 324.

An ECC encoder can generate each encoded data entry 320 by using a generator polynomial $g(x)$ to transform an original data sequence $i(x)$ into a codeword $c(x)$ corresponding to the encoded data entry 320. The coefficients of the generator polynomial can be represented as a coding matrix. Although the entire encoded data entry 320 can be treated as a codeword, the output of an ECC encoder usually preserves the original data, e.g., so that the bits in an original data sequence have a one-to-one correspondence with the data bits 322, assuming the data bits 322 are written to memory correctly. FIG. 3 shows each sequence of check bits 324 as being stored after (appended to) its corresponding sequence of data bits 322. However, in some implementations, the check bits 324 may be stored separately or in a different order.

In the example of FIG. 3, the entirety of a codeword (e.g., encoded data entry 320) is stored in an array on a single memory device. However, as discussed earlier, data can be stored in a distributed manner across multiple memory devices. For example, the encoded data entry 320 could be stored in two or more of the memory devices 220 in FIG. 2 using data striping, so that reading the encoded data entry 320 involves concurrent or parallel reads to corresponding locations in different memory devices 220. In such instances, some of the locations from which the encoded data entry 320 is read may be associated with erasure errors, while other locations from which the encoded data entry 320 is read may not be associated with erasure errors.

A received version $r(x)$ of the codeword $c(x)$ as read out of memory corresponds to the sum of the codeword $c(x)$ plus an error polynomial $e(x)$. An ECC decoder can execute one of various algorithms, such as the Berlekamp-Massey algorithm or Euclid's algorithm, to compute an error locator polynomial. The ECC decoder can calculate the roots of the error locator polynomial based on solving a system of linear equations to identify error locations. Error locations can then be input to a separate algorithm (e.g., the Forney algorithm) to compute error magnitudes/values for the error locations based on solving another system of linear equations. The error locations that are input to this separate algorithm can include error locations which are known in advance (e.g., erasure errors) or error locations identified as a result of solving for the roots of the error locator polynomial. If the total amount of errors does not exceed the code correction capability, the errors can then be corrected through computing the error polynomial $e(x)$ using the error locations and the error magnitudes at those locations.

Figure 4:
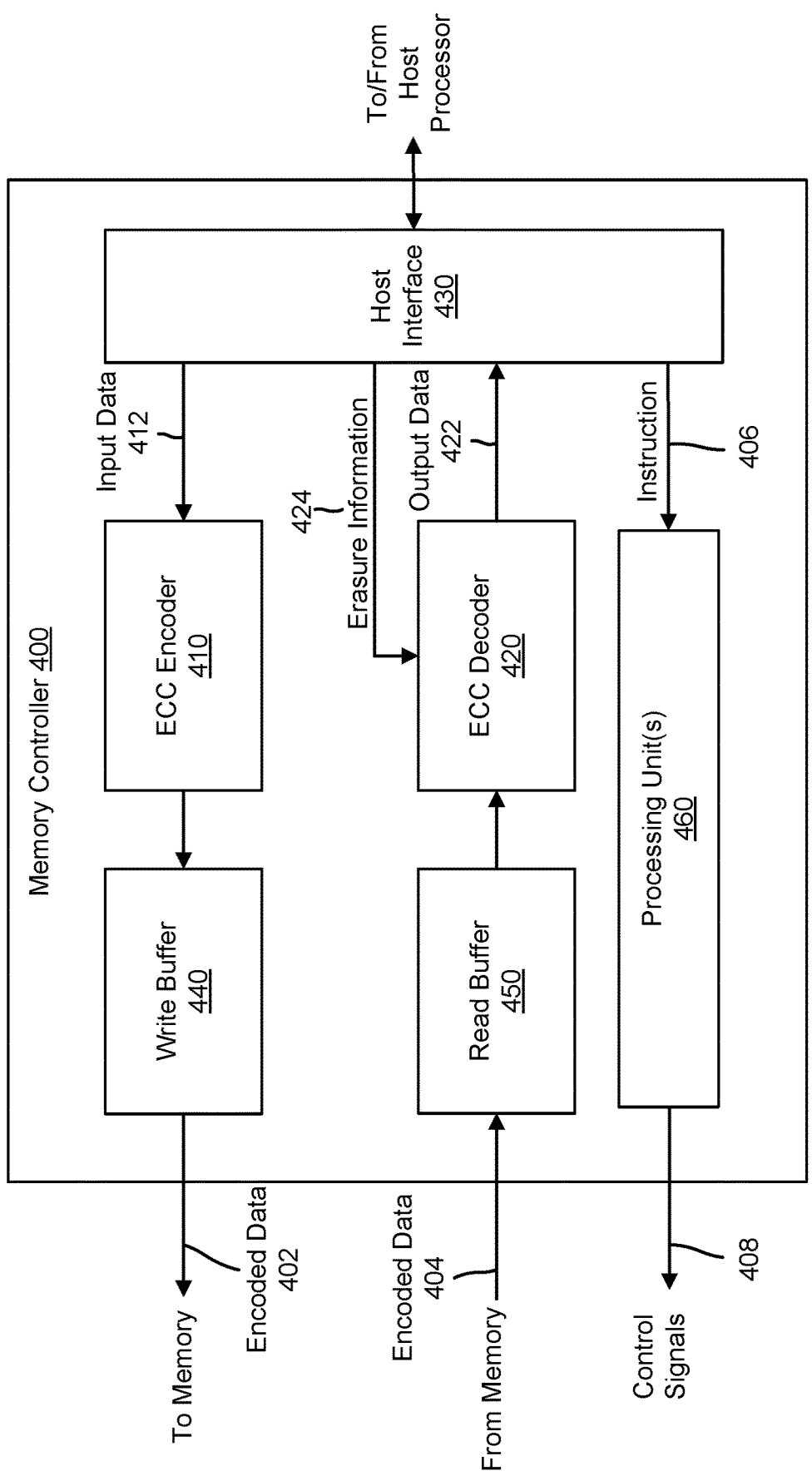
FIG. 4 is a simplified block diagram of a memory controller according to an embodiment.

FIG. 4 is a simplified block diagram of a memory controller 400 according to an embodiment. The memory controller 400 may correspond to the memory controller 130 in FIG. 1. Memory controller 400 includes an ECC encoder 410, an ECC decoder 420, a host interface 430, a write buffer 440, a read buffer 450, and one or more processing units 460.

Host interface 430 can couple the memory controller 400 to one or more host processors (not shown). For instance, the host interface 430 can be connected to a communication bus shared by multiple host processors. The host processors may correspond to the processing unit(s) 110 in FIG. 1. For example, in a computer system such as the computer system 100, the host interface 430 may be configured to communicate data and instructions between the memory controller 400 and a CPU, a GPU, a processor of a hard drive controller, and the like. In some implementations, the memory controller 400 and the one or more host processors may reside on different computer systems or devices. For instance, the memory controller 400 can be part of an integrated circuit device that performs memory management operations on behalf of a processor in a host system. Memory managed by the memory controller 400 (e.g., the physical memory 120 in FIG. 1) can reside on the same computer system or device as the memory controller 400, on the host system, or on a computer system or device separate from both the memory controller 400 and the host system.

Host interface 430 can be configured to communicate wirelessly or through wireline connections such as the above-mentioned communication bus. Data communicated between the memory controller 400 and a host processor via the host interface 430 can include input data 412 supplied by the host processor for writing into physical memory and/or output data 422 requested to be read out of physical memory by the host processor.

Processing unit(s) 460 can be configured to issue read commands and/or write commands to physical memory based on an instruction 406 received from a host processor. For example, the instruction 406 can be a macro instruction that can be executed using atomic memory operations, for example, a sequence of read and/or write operations to specific addresses within an address space associated with the physical memory. Upon receipt of such a macro instruction, the processing unit(s) 460 may decode the macro instruction to generate commands for implementing the atomic memory accesses. In the embodiment of FIG. 4, the commands are issued in the form of control signals 408, which can be communicated to the physical memory via a communication bus such as the memory bus 250 in FIG. 2.

The physical memory can, in response to receiving the control signals 408, configure itself to receive encoded data 402 for writing into a memory location indicated by the control signals 408 or to supply encoded data 404 from a memory location indicated by the control signals 408.

ECC encoder 410 can be implemented in software, hardware, or a combination of software and hardware. The ECC encoder 410 can be configured to generate ECCs by encoding the input data 412 received via the host interface 430. In some implementations, the ECC encoder 410 may include circuitry (e.g., an application-specific integrated circuit (ASIC) or a field-programmable gate array (FPGA)) configured to execute an ECC encoding algorithm such as a Reed-Solomon encoding algorithm. The ECC encoding algorithm executed by the ECC encoder 410 can output ECCs as encoded data 402. The encoded data 402 may correspond to, for example, the encoded data entry 320 in FIG. 3. In other implementations, an ECC encoding algorithm may be implemented in program code, with the program code being executable by a processing unit local to the ECC encoder 410 or by a processing unit 460.

Write buffer 440 can be configured to temporarily store the encoded data 402 for transmission to the physical memory. For example, the write buffer 440 may store the encoded data 402 in a queue and dequeue the encoded data 402 based on a rate at which the physical memory can consume such data. In some implementations, a separate write buffer (not depicted) may be coupled to the input side of the ECC encoder 410 to provide buffering for the input data 412.

ECC decoder 420 can be implemented in software, hardware, or a combination of software and hardware. The ECC decoder 420 can be configured to decode the encoded data 404 supplied from the physical memory (e.g., the encoded data entry 320 as read out of array 302d). The decoding of the encoded data 404 produces output data 422 for output to a host processor via the host interface 430. As with the ECC encoder 410, in some implementations, the ECC decoder 420 may include circuitry configured to execute an ECC decoding algorithm such as a Reed-Solomon decoding algorithm. For instance, as discussed above, decoding of Reed-Solomon codes can involve error decoding or erasure decoding and can be performed using one or more algorithms configured to detect error locations, calculate error magnitudes, and/or correct errors. In other implementations, an ECC decoding algorithm may be implemented in program code, with the program code being executable by a processing unit local to the ECC decoder 420 or by a processing unit 460. For example, error location detection, error value calculation, and error correction can be implemented as software routines executed by a processor in ECC decoder 420.

As discussed above, erasure decoding involves use of erasure information indicating known locations of errors that are correctable through erasure decoding, and a memory controller can be configured to detect such errors based on reading data from memory. Accordingly, in some embodiments, the ECC decoder 420 may be configured to generate and/or update erasure information. For example, ECC decoder 420 may, based on recognizing an error (e.g., erroneous bits having incorrect values) in the encoded data 404, flag a location from which the encoded data 404 was read as potentially being associated with an erasure error. If repeated accesses to the same location result in the same error (e.g. a threshold number of occurrences of the same error are encountered), the ECC decoder 420 may deem the location as having an erasure error and update stored erasure information to mark the location as being an erasure location. For example, the ECC decoder 420 could, after flagging a particular location, read a "new" ECC from the particular location, perform error decoding on the new ECC to determine that the same error (e.g., the same erroneous bits) is repeated in a result of the error decoding performed on the new ECC, and then in response, cause the memory controller to update the erasure information to indicate that the particular location is associated with an erasure error. If the new ECC is read before the data in the particular location gets overwritten, then the new ECC should be the same as the previously read ECC, assuming that the particular location does not experience any more errors between the earlier read and the subsequent read. However, the new ECC could be different from the previously read ECC due to the data in the particular location being overwritten, in which case the error in the new ECC may involve one or more erroneous bits that are different in value than the erroneous bits of the previously read ECC, but which are in an identical bit position(s).

In some embodiments, the ECC decoder 420 may be configured to confirm erasure locations by issuing follow-up commands to access a location that has been flagged as potentially being associated with an erasure error. Such follow-up commands can be issued without involving a host processor. Additionally, in some embodiments, the ECC decoder 420 may receive erasure information 424 from a source external to the memory controller 400. For example, the erasure information 424 can be supplied by a host processor based on the host processor determining that the output data 422 has an erasure error. Regardless of how the erasure information is generated, the memory controller 400 may be configured to restrict the erasure decoding performed by the ECC decoder 420 to locations indicated by the erasure information. For other locations not indicated by the erasure information as being associated with an erasure error (e.g., locations for which erasure information is not available), the ECC decoder 420 can apply regular error decoding to the same ECCs that would have been decoded using erasure decoding had erasure information pertaining to such other locations been available. ECCs from such other locations can be decoded under the assumption that no erasure errors exist in these locations.

ECC decoder 420 can store erasure information in a memory of the memory controller 400 or in external memory accessible to the memory controller 400, such as the data store 140 in FIG. 1. In some embodiments, erasure information may be stored in the form of a lookup table, e.g., a table indexed according to memory address. Further, as discussed above, erasure information can indicate erasure errors at different hierarchy levels. Accordingly, a lookup table storing erasure information may be indexed such that a lookup operation can be performed using information identifying a rank, a memory device, a bank group, a bank, a row, a column, or some other level in a memory hierarchy.

ECC decoder 420 can be configured to output the output data 422 conditional upon there being an absence of non-recoverable errors. A result of a decoding operation performed by the ECC decoder 420 may indicate one of three scenarios. The original data (i.e., the output data 422 with no errors) may be decoded successfully, for example, decoded without error or after applying error correction. This can occur when the total number of errors is less than or equal to some maximum number of correctable errors (e.g., between t and floor(t/2) when using Reed-Solomon codes, as discussed above), with the maximum number depending on whether erasure information is available for the location being accessed. However, if the total number of errors exceeds the maximum, the result of the decoding operation may indicate that the ECC decoder 420 was unable to recover the original data. In this scenario, the memory controller 400 may output an indication of a memory error to the host processor. Alternatively, the memory controller 400 can initiate a shutdown of the computer/machine on which the memory that was accessed (e.g., the physical memory 120) resides. The memory controller 400 can initiate the shutdown by, for example, triggering an interrupt via the host interface 430. Additionally, in some embodiments, the ECC decoder 420 or the memory controller 400 may be configured to output an indication of a memory error or initiate a shutdown in response to determining, based on erasure information, that a threshold number of erasure errors has been reached. For example, the memory controller 400 may be configured with a limit on the total number of rows that are permitted to be associated with erasure errors. Another possible scenario is that the ECC decoder 420 may be unable to detect that the maximum number of errors has been exceeded, in which case the ECC decoder 420 may permit the output data 422 to be transmitted to the host processor with "silent" errors.

Read buffer 450 can be configured to temporarily store the encoded data 404 supplied from the physical memory for decoding by the ECC decoder 420. For example, the read buffer 450 may store the encoded data 404 in a queue and dequeue the encoded data 404 based on a rate at which the ECC decoder can consume such data. In some implementations, a separate read buffer may be provided on the output side of the ECC decoder 420 to provide buffering for the output data 422.

Figure 5:
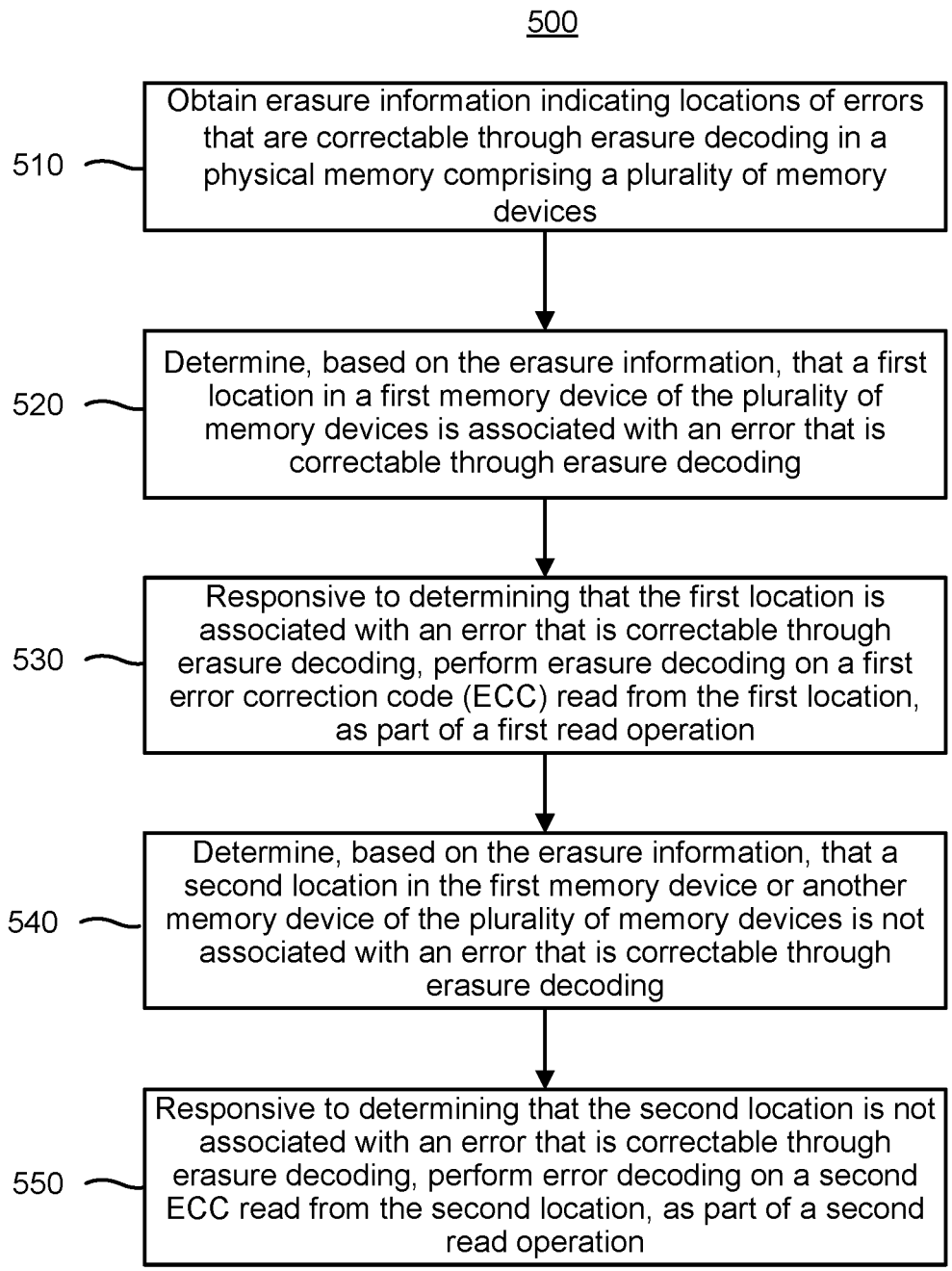
FIG. 5 is a flow chart illustrating a method for selective erasure decoding according to an embodiment.

FIG. 5 is a flow chart illustrating a method 500 for selective erasure decoding according to an embodiment. The method 500 can be implemented by the systems, apparatuses, and devices described above, for example, the memory controller 130 in FIG. 1. More specifically, the method 500 involves functionality that can be implemented using an ECC decoder, for example, the ECC decoder 420 in FIG. 4.

At block 510, erasure information is obtained, for example, from a table maintained in a data store such as data store 140. The erasure information obtained in 510 indicates locations of erasure errors in a physical memory that includes a plurality of memory devices (e.g., DRAM chips). Further, the erasure information can indicate locations at different hierarchy levels of the physical memory including, for example, regions within individual memory devices that form the physical memory.

At block 520, a determination is made, based on the erasure information obtained in 510, that a first location in a first memory device of the plurality of memory devices is associated with an erasure error. For example, the erasure information may indicate that a particular row in a memory device has an erasure error or that a particular bank in a memory device has an erasure error.

At block 530, erasure decoding is performed in response to the determination in 520 that the first location is associated with an erasure error. The erasure decoding in 530 is performed on a first ECC read from the first location and may be performed as part of a first read operation. As discussed above, various types of ECCs are available including, for example, Reed-Solomon codes. An erasure decoding algorithm specific to the ECC type of the first ECC can be executed, for example, by the ECC decoder 420, to perform the erasure decoding. Although the erasure information obtained in 510 can indicate where an erasure error is located (and with variable or configurable levels of specificity), the erasure information may not indicate the error magnitude, and therefore what the correct value for the erasure error should be. Therefore, an error magnitude may be calculated as part of the erasure decoding in 530. The erasure error corresponding to the first location can then be corrected based on the calculated error magnitude. Erasure correction may also be performed as part of the erasure decoding in 530 to form output data for consumption by a processor or other computing device that initiated the first read operation.

At block 540, a determination is made, based on the erasure information obtained in 510, that a second location in the physical memory is not associated with an erasure error. For example, the ECC decoder 420 may perform a lookup for the second location to determine that the second location has not been marked as having an erasure error. The second location can be a location in the first memory device (the device having the first location). Alternatively, the second location can be a location in another memory device of the plurality of memory devices that form the physical memory.

At block 550, error decoding is performed in response to the determination in 540 that the second location is not associated with an erasure error. The error decoding in 550 can be performed by the same component (e.g., ECC decoder 420) that performed the erasure decoding in 530 and as part of a second read operation. The error decoding in 550 may involve identifying any errors that were unknown prior to the error decoding, as well as the locations of such errors. Similar to the erasure decoding in 530, the error decoding in 550 may involve calculating an error magnitude to perform a corresponding correction and to generate output data for consumption by a processor or other computing device that initiated the second read operation. Although the second location in block 540 is not associated with an erasure error, a read operation can involve concurrent or parallel accesses to multiple locations, some of which may be associated with erasure errors. This could be because the ECC/codeword corresponding to the second location is stored in a distributed manner across the second location and a third location (e.g., a row of a third memory device) so that the second read operation involves concurrent or parallel reading of the second location and the third location. For example, a first portion of a second ECC could be stored in the second location and a second portion of the second ECC could be stored in the third location, with the first portion and the second portion each having their own parity bits. Based on the erasure information indicating that the third location is associated with an erasure error, erasure decoding could be applied to the second portion of the second ECC to correct for an erasure error in the third location, similar to the erasure decoding performed with respect to the first location in block 530. In this manner, erasure decoding can be selectively applied to different locations that are accessed as part of the same read operation or as part of separate read operations.

Figure 6:
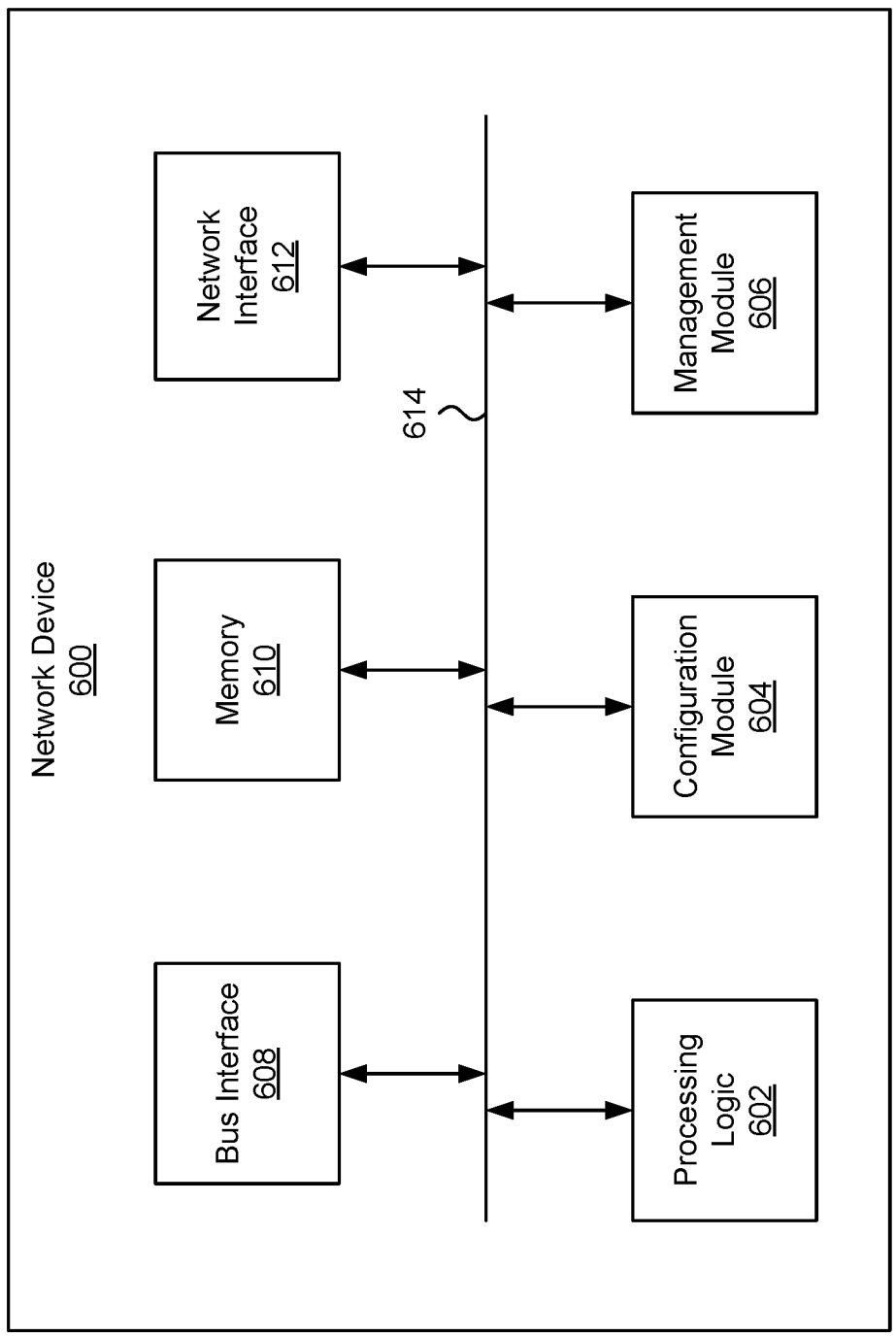
FIG. 6 illustrates an example of a network device, according to certain aspects of the disclosure.

In some embodiments, the ECC-related functionality described above may be implemented using a network device. FIG. 6 illustrates an example of a network device 600. Functionality and/or several components of the network device 600 may be used without limitation with other embodiments disclosed elsewhere in this disclosure, without limitations. A network device 600 may facilitate processing of packets and/or forwarding of packets from the network device 600 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the network device 600 may be the recipient and/or generator of packets. In some implementations, the network device 600 may modify the contents of the packet before forwarding the packet to another device. The network device 600 may be a peripheral device coupled to another computer device, a switch, a router or any other suitable device enabled for receiving and forwarding packets.

In one example, the network device 600 may include processing logic 602, a configuration module 604, a management module 606 (e.g., a memory controller), a bus interface module 608, memory 610 (e.g., a physical memory including a plurality of memory devices), and a network interface module 612. These modules may be hardware modules, software modules, or a combination of hardware and software. In certain instances, modules may be interchangeably used with components or engines, without deviating from the scope of the disclosure. The network device 600 may include additional modules, not illustrated here, such as components discussed with respect to the nodes disclosed in FIG. 7. In some implementations, the network device 600 may include fewer modules. In some implementations, one or more of the modules may be combined into one module. One or more of the modules may be in communication with each other over a communication channel 614. The communication channel 614 may include one or more busses, meshes, matrices, fabrics, a combination of these communication channels, or some other suitable communication channel.

The processing logic 602 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 602 may include processors developed by ARM®, MIPS®, AMID®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 602 may be stored on a computer-readable storage medium, for example, in the form of a computer program. The computer-readable storage medium may be non-transitory. In some cases, the computer-readable medium may be part of the memory 610.

The memory 610 may include either volatile or non-volatile, or both volatile and non-volatile types of memory. The memory 610 may, for example, include random access memory (RAM), read only memory (ROM), Electrically Erasable Programmable Read-Only Memory (EEPROM), flash memory, and/or some other suitable storage media. In some cases, some or all of the memory 610 may be internal to the network device 600, while in other cases some or all of the memory may be external to the network device 600. The memory 610 may store an operating system comprising executable instructions that, when executed by the processing logic 602, provides the execution environment for executing instructions providing networking functionality for the network device 600. The memory may also store and maintain several data structures and routing tables for facilitating the functionality of the network device 600.

In some implementations, the configuration module 604 may include one or more configuration registers. Configuration registers may control the operations of the network device 600. In some implementations, one or more bits in the configuration register can represent certain capabilities of the network device 600. Configuration registers may be programmed by instructions executing in the processing logic 602, and/or by an external entity, such as a host device, an operating system executing on a host device, and/or a remote device. The configuration module 604 may further include hardware and/or software that control the operations of the network device 600.

In some implementations, the management module 606 may be configured to manage different components of the network device 600. In some cases, the management module 606 may configure one or more bits in one or more configuration registers at power up, to enable or disable certain capabilities of the network device 600. In certain implementations, the management module 606 may use processing resources from the processing logic 602. In other implementations, the management module 606 may have processing logic similar to the processing logic 602, but segmented away or implemented on a different power plane than the processing logic 602.

The bus interface module 608 may enable communication with external entities, such as a host device and/or other components in a computing system, over an external communication medium. For example, bus interface module 608 can be a shared bus that combines the functionality of the memory bus 250 in FIG. 2 with that of a communication bus coupling a memory controller to a host processor. The bus interface module 608 may include a physical interface for connecting to a cable, socket, port, or other connection to the external communication medium. The bus interface module 608 may further include hardware and/or software to manage incoming and outgoing transactions. The bus interface module 608 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 608 may include the physical layer for any of these bus protocols, including a connector, power management, and error handling, among other things. In some implementations, the network device 600 may include multiple bus interface modules for communicating with multiple external entities. These multiple bus interface modules may implement the same local bus protocol, different local bus protocols, or a combination of the same and different bus protocols.

The network interface module 612 may include hardware and/or software for communicating with a network. This network interface module 612 may, for example, include physical connectors or physical ports for wired connection to a network, and/or antennas for wireless communication to a network. The network interface module 612 may further include hardware and/or software configured to implement a network protocol stack. The network interface module 612 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the network device 600 may include multiple network interface modules, each configured to communicate with a different network. For example, in these implementations, the network device 600 may include a network interface module for communicating with a wired Ethernet network, a wireless 802.11 network, a cellular network, an Infiniband network, etc.

The various components and modules of the network device 600, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed with respect to FIG. 7.

Figure 7:
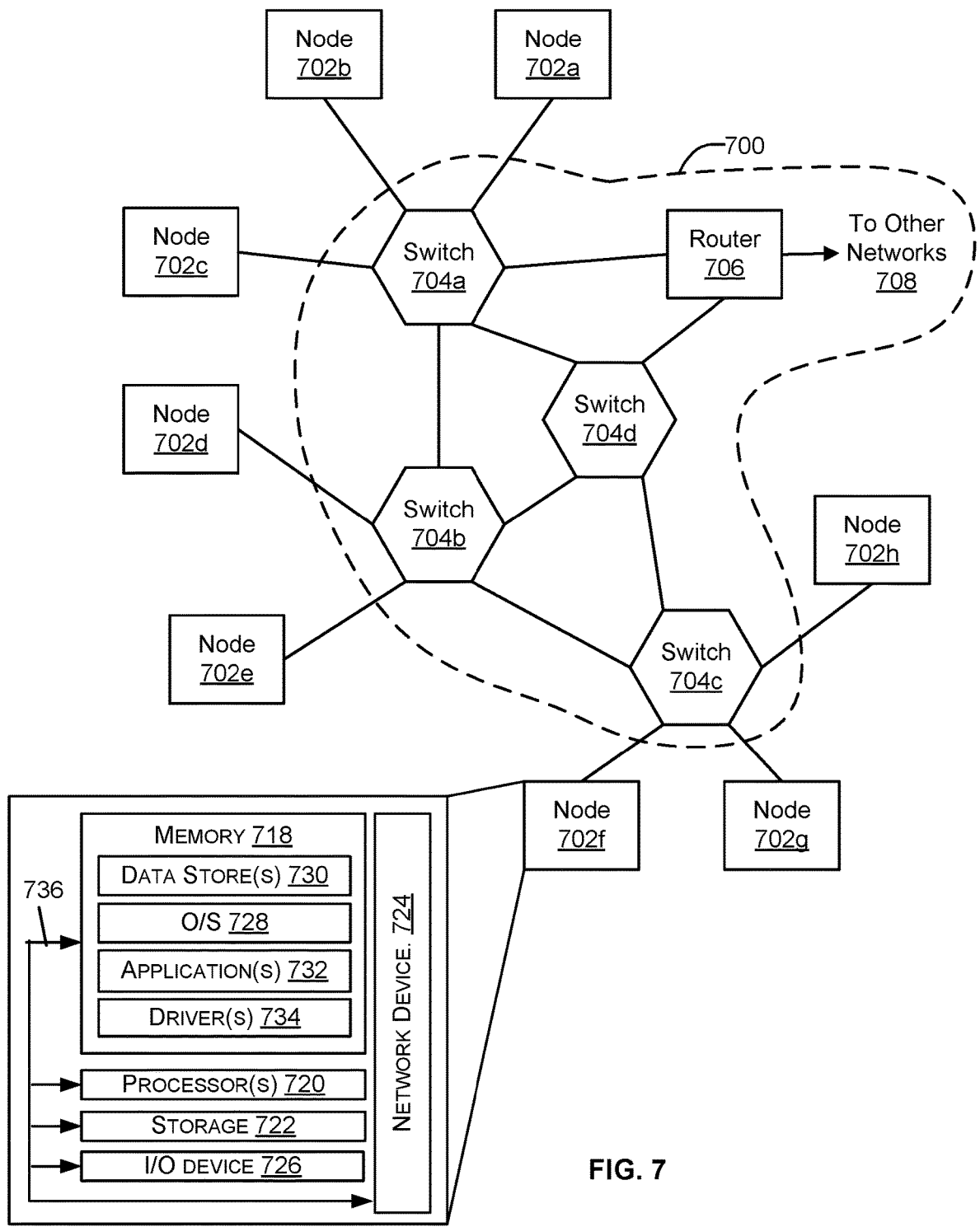
FIG. 7 illustrates an example architecture for features and systems described herein that includes one or more service provider computers and/or a user device connected via one or more networks, according to certain aspects of the disclosure.

FIG. 7 illustrates a network 700 featuring various different types of network devices 600 of FIG. 6, such as nodes comprising the network device, switches and routers. In certain embodiments, the network 700 may be based on a switched architecture with point-to-point links. As illustrated in FIG. 7, the network 700 includes a plurality of switches 704a-704d, which may be arranged in a network. In some cases, the switches are arranged in a multi-layered network, such as a Clos network. A network device 600 that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 704a-704d may be connected to a plurality of nodes 702a-702h and provide multiple paths between any two nodes.

The network 700 may also include one or more network devices 600 for connection with other networks 708, such as other subnets, LANs, wide area networks (WANs), or the Internet, and may be referred to as routers 706. Routers use headers and forwarding tables to determine the best path for forwarding the packets, and use protocols such as internet control message protocol (ICMP) to communicate with each other and configure the best route between any two devices.

In some examples, network(s) 700 may include any one or a combination of many different types of networks, such as cable networks, the Internet, wireless networks, cellular networks and other private and/or public networks. Interconnected switches 704a-704d and router 706, if present, may be referred to as a switch fabric, a fabric, a network fabric, or simply a network. In the context of a computer network, terms "fabric" and "network" may be used interchangeably herein.

Nodes 702a-702h may be any combination of host systems, processor nodes, storage subsystems, and I/O chassis that represent user devices, service provider computers or third party computers. Accordingly, the network 700 can be configured to permit data residing in physical memory (e.g., memory 718) of a first node of the nodes 702a-702h to be transmitted for processing and/or storage by a second node of the nodes 702a-702h. Such transmission can be facilitated by a memory controller residing in the first node and/or a memory controller residing in the second node, where at least one of these memory controllers is configured with the ECC-related capabilities described above with respect to FIGS. 1-5.

User devices may include computing devices to access an application 732 (e.g., a web browser or mobile device application). In some aspects, the application 732 may be hosted, managed, and/or provided by a computing resources service or service provider. The application 732 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 708. Additionally, the user device(s) may be part of the distributed system managed by, controlled by, or otherwise part of the service provider computer(s) (e.g., a console device integrated with the service provider computers).

The node(s) of FIG. 7 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 732 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 702a-702h may include at least one memory 718 and one or more processing units (or processor(s) 720). The processor(s) 720 may be implemented in hardware, computer-executable instructions, firmware, or combinations thereof. Computer-executable instruction or firmware implementations of the processor(s) 720 may include computer-executable or machine-executable instructions written in any suitable programming language to perform the various functions described.

In some instances, the hardware processor(s) 720 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 718 may store program instructions that are loadable and executable on the processor(s) 720, as well as data generated during the execution of these programs. Depending on the configuration and type of the node(s) 702a-702h, the memory 718 may be volatile (such as RAM) and/or non-volatile (such as ROM, flash memory, etc.). The memory 718 may include an operating system 728, one or more data stores 730, one or more application programs 732, one or more drivers 734, and/or services for implementing the features disclosed herein.

The operating system 728 may support nodes 702a-702h basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 728 may also be a proprietary operating system.

The data stores 730 may include permanent or transitory data used and/or operated on by the operating system 728, application programs 732, or drivers 734. Examples of such data include web pages, video data, audio data, images, user data, and so on. The information in the data stores 730 may, in some implementations, be provided over the network(s) 708 to user devices 704. In some cases, the data stores 730 may additionally or alternatively include stored application programs and/or drivers. Alternatively or additionally, the data stores 730 may store standard and/or proprietary software libraries, and/or standard and/or proprietary application user interface (API) libraries. Information stored in the data stores 730 may be machine-readable object code, source code, interpreted code, or intermediate code.

The drivers 734 include programs that may provide communication between components in a node. For example, some drivers 734 may provide communication between the operating system 728 and additional storage 722, network device 724, and/or I/O device 726. Alternatively or additionally, some drivers 734 may provide communication between application programs 732 and the operating system 728, and/or application programs 732 and peripheral devices accessible to the service provider computer. In many cases, the drivers 734 may include drivers that provide well-understood functionality (e.g., printer drivers, display drivers, hard disk drivers, Solid State Device drivers). In other cases, the drivers 734 may provide proprietary or specialized functionality.

The service provider computer(s) or servers may also include additional storage 722, which may include removable storage and/or non-removable storage. The additional storage 722 may include magnetic storage, optical disks, solid state disks, flash memory, and/or tape storage. The additional storage 722 may be housed in the same chassis as the node(s) 702a-702h or may be in an external enclosure. The memory 718 and/or additional storage 722 and their associated computer-readable media may provide non-volatile storage of computer-readable instructions, data structures, program modules, and other data for the computing devices. In some implementations, the memory 718 may include multiple different types of memory, such as SRAM, DRAM, or ROM.

The memory 718 and the additional storage 722, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 718 and the additional storage 722 are examples of computer storage media. Additional types of computer storage media that may be present in the node(s) 702a-702h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 702a-702h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 702a-702h may also include I/O device(s) 726, such as a keyboard, a mouse, a pen, a voice input device, a touch input device, a display, speakers, a printer, and the like. The node(s) 702a-702h may also include one or more communication channels 736. A communication channel 736 may provide a medium over which the various components of the node(s) 702a-702h can communicate. The communication channel or channels 736 may take the form of a bus, a ring, a switching fabric, or a network.

The node(s) 702a-702h may also contain network device(s) 724 that allow the node(s) 702a-702h to communicate with a stored database, another computing device or server, user terminals and/or other devices on the network(s) 700. The network device(s) 724 of FIG. 7 may include similar components discussed with reference to the network device 600 of FIG. 6.

In some implementations, the network device 724 is a peripheral device, such as a PCI-based device. In these implementations, the network device 724 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 608 may implement NVMe, and the network device 724 may be connected to a computing system using a PCIe interface.

A PCI-based device may include one or more functions. A "function" describes operations that may be provided by the network device 724. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 724 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 6, FIG. 7, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein. Variations of those embodiments may become apparent to those of ordinary skill in the art upon reading the foregoing description. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:
1. An apparatus comprising:
a physical memory including a dynamic random-access memory (DRAM) module having a plurality of DRAM devices;
a processor configured to generate instructions to access the physical memory; and a memory controller configured to:
  receive a first read instruction from the processor;
  determine that the first read instruction is to access a first location in a first DRAM device of the plurality of DRAM devices;
  obtain erasure information indicating locations of errors that are correctable through erasure decoding in the DRAM module;
  determine, using the erasure information, that the first location is associated with an error that is correctable through erasure decoding;
  responsive to determining that the first location is associated with an error that is correctable through erasure decoding, perform erasure decoding on a first error correction code (ECC) read from the first location;
  receive a second read instruction from the processor;
  determine that the second read instruction is to access a second location in the first DRAM device;
  determine, using the erasure information, that the second location is not associated with an error that is correctable through erasure decoding; and
  responsive to determining that the second location is not associated with an error that is correctable through erasure decoding, perform error decoding on a second ECC read from the second location, wherein as part of performing error decoding on the second ECC, the memory controller is configured to determine whether there is an error represented in the second ECC and, if so, a location of the error represented in the second ECC.

2. The apparatus of claim 1, wherein the erasure information is stored in a table accessible to the memory controller, wherein the table is initialized by a computing device external to the memory controller and indicates locations in different DRAM devices of the plurality of DRAM devices, and wherein to access the erasure information, the memory controller is configured to read from the table.

3. The apparatus of claim 2, wherein the locations indicated by the table correspond to different hierarchy levels of the DRAM module, the different hierarchy levels including any combination of the following: physical rank, logical rank, DRAM device, bank group, bank, row, or column.

4. A memory controller configured to:
  determine, based on erasure information indicating locations of errors that are correctable through erasure decoding in a physical memory comprising a plurality of memory devices, that a first location in a first memory device of the plurality of memory devices is associated with an error that is correctable through erasure decoding;
  responsive to determining that the first location is associated with an error that is correctable through erasure decoding, perform erasure decoding on a first error correction code (ECC) read from the first location, as part of a first read operation;
  determine, based on the erasure information, that a second location in the first memory device or in a second memory device of the plurality of memory devices is not associated with an error that is correctable through erasure decoding; and
  responsive to determining that the second location is not associated with an error that is correctable through erasure decoding, perform error decoding on a second ECC read from the second location, as part of a second read operation.

5. The memory controller of claim 4, wherein the first ECC and the second ECC are Bose-Chaudhuri-Hocquenghem (BCH) or Reed-Solomon codes, and wherein to perform the erasure decoding on the first ECC, the memory controller is configured to use the first location as an input to a BCH or Reed-Solomon decoding algorithm.

6. The memory controller of claim 4, wherein the erasure information indicates locations that correspond to different hierarchy levels of the physical memory.

7. The memory controller of claim 4, wherein the memory controller is further configured to:
  after the first read operation and the second read operation, obtain updated erasure information indicating locations of errors that are correctable through erasure decoding; and
  determine, based on the updated erasure information, whether to perform erasure decoding or error decoding in connection with a subsequent read operation that accesses a location in the physical memory.

8. The memory controller of claim 7, wherein the updated erasure information is generated based on detection of an error, in the first ECC and correctable through erasure decoding, upon completion of the first read operation or detection of an error, in the second ECC and correctable through erasure decoding, upon completion of the second read operation.

9. The memory controller of claim 4, wherein the memory controller is further configured to:
  perform error decoding on a third ECC read from a third location in the physical memory;
  determine, based on the error decoding performed on the third ECC, that an error is present in a bit of the third ECC; and
  responsive to determining that the error is present in the bit of the third ECC, flag the third location as potentially being associated with an error that is correctable through erasure decoding.

10. The memory controller of claim 9, wherein the memory controller is further configured to:
  after flagging the third location, perform error decoding on a fourth ECC read from the third location, wherein the fourth ECC is the same as the third ECC or the fourth ECC is a different ECC that replaced the third ECC when the third location was overwritten;
  determine, based on the decoding performed on the fourth ECC, that an error in the same bit as the error in the third ECC is present in the fourth ECC; and
  responsive to determining that the error in the fourth ECC is in the same bit as the error in the third ECC, update the erasure information to indicate that the third location is associated with an error that is correctable through erasure decoding.

11. The memory controller of claim 4, wherein the erasure information is stored in a table, and wherein the memory controller is configured to access the table to determine whether to perform erasure decoding or error decoding for each read operation.

12. The memory controller of claim 11, wherein the table is initialized by a computing device external to the memory controller.

13. The memory controller of claim 4, wherein the physical memory includes one or more dynamic random-access memory (DRAM) modules, each DRAM module including a plurality of DRAM devices, and wherein the erasure information indicates locations within individual DRAM devices that are associated with errors that are correctable through erasure decoding.

14. The memory controller of claim 4, wherein the second location is in the second memory device, wherein the second read operation involves reading a first portion of the second ECC from the second location in parallel with reading a second portion of the second ECC from a third location in a third memory device, and wherein the memory controller is further configured to:
- determine, based on the erasure information, that the third location is associated with an error that is correctable through erasure decoding; and
- responsive to determining that the third location is associated with an error that is correctable through erasure decoding, perform erasure decoding on the second portion of the second ECC, as part of the second read operation.

15. The memory controller of claim 4, wherein the memory controller is configured to, in response to determining based on the erasure information that a threshold number of errors that are correctable through erasure decoding has been reached, output an indication of a memory error or initiate a shutdown of a computer on which the physical memory resides.

16. The memory controller of claim 4, wherein the memory controller is further configured to:
- issue commands to the physical memory for reading the first location in parallel with reading the second location; and
- determine, using the erasure information, whether the first location is associated with an error that is correctable through erasure decoding concurrently with determining whether the second location is associated with an error that is correctable through erasure decoding.

17. A method for selective erasure decoding, the method comprising:
- determining, by a memory controller and based on erasure information indicating locations of errors that are correctable through erasure decoding in a physical memory comprising a plurality of memory devices, that a first location in a first memory device of the plurality of memory devices is associated with an error that is correctable through erasure decoding;
- responsive to determining that the first location is associated with an error that is correctable through erasure decoding, performing, by the memory controller, erasure decoding on a first error correction code (ECC) read from the first location, as part of a first read operation;
- determining, by the memory controller and based on the erasure information, that a second location in the first memory device or a second memory device of the plurality of memory devices is not associated with an error that is correctable through erasure decoding; and
- responsive to determining that the second location is not associated with an error that is correctable through erasure decoding, performing, by the memory controller, error decoding on a second ECC read from the second location, as part of a second read operation.

18. The method of claim 17, wherein the erasure information indicates locations that correspond to different hierarchy levels of the physical memory.

19. The method of claim 17, further comprising:
- performing, by the memory controller, error decoding on a third ECC read from a third location in the physical memory;
- determining, based on the error decoding performed on the third ECC, that an error is present in a bit of the third ECC;
- responsive to determining that the error is present in the bit of the third ECC, flagging the third location as potentially being associated with an error that is correctable through erasure decoding;
- after the third location has been flagged, performing, by the memory controller, error decoding on a fourth ECC read from the third location, wherein the fourth ECC is the same as the third ECC or the fourth ECC is a different ECC that replaced the third ECC when the third location was overwritten;
- determining, based on the decoding performed on the fourth ECC, that an error in the same bit as the error in the third ECC is present in the fourth ECC; and
- responsive to determining that the error in the fourth ECC is in the same bit as the error in the third ECC, updating the erasure information to indicate that the third location is associated with an error that is correctable through erasure decoding.

20. The method of claim 17, further comprising:
- determining, based on the erasure information, that a third location in a third memory device of the plurality of memory devices is associated with an error that is correctable through erasure decoding, wherein the second location is in the second memory device, and wherein the second read operation involves reading a first portion of the second ECC from the second location in parallel with reading a second portion of the second ECC from the third location; and
- responsive to determining that the third location is associated with an error that is correctable through erasure decoding, performing erasure decoding on the second portion of the second ECC, as part of a third read operation.

* * * * *